(12) United States Patent
Hossain et al.

(10) Patent No.: US 11,342,238 B2
(45) Date of Patent: May 24, 2022

(54) ROTATABLE ARCHITECTURE FOR MULTI-CHIP PACKAGE (MCP)

(71) Applicant: Intel Corporation, Santa Clara, CA (US)

(72) Inventors: MD Altaf Hossain, Portland, OR (US); Ankireddy Nalamalpu, Portland, OR (US); Dheeraj Subbareddy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 733 days.

(21) Appl. No.: 16/022,983

(22) Filed: Jun. 29, 2018

(65) Prior Publication Data

US 2020/0006175 A1    Jan. 2, 2020

(51) Int. Cl.
*H01L 23/31* (2006.01)
*H01L 23/00* (2006.01)
*H01L 25/065* (2006.01)

(52) U.S. Cl.
CPC .......... *H01L 23/3114* (2013.01); *H01L 24/49* (2013.01); *H01L 25/0657* (2013.01); *H01L 2225/06527* (2013.01)

(58) Field of Classification Search
CPC . H01L 23/3114; H01L 24/49; H01L 25/0657; H01L 225/06527
See application file for complete search history.

(56) References Cited

U.S. PATENT DOCUMENTS

2016/0350240 A1*  12/2016  Grafton .............. G06F 13/1668
2018/0358313 A1*  12/2018  Newman ............ G06F 12/0802

* cited by examiner

*Primary Examiner* — Marc Anthony Armand
(74) *Attorney, Agent, or Firm* — Fletcher Yoder, PC

(57) ABSTRACT

A multi-chip packaged device may include a first integrated circuit die with a first integrated circuit, such that the first integrated circuit may include a first plurality of ports disposed on a first side and a second plurality of ports disposed on a second side of the first integrated circuit die. The multi-chip packaged device may also include a second integrated circuit die, such that the second integrated circuit may include a third plurality of ports disposed on a third side of the second integrated circuit die. The first integrated circuit may communicate with the first side of the second integrated circuit when placed adjacent to the first side and communicate with the second side of the first integrated circuit die when placed adjacent to the second side.

20 Claims, 7 Drawing Sheets

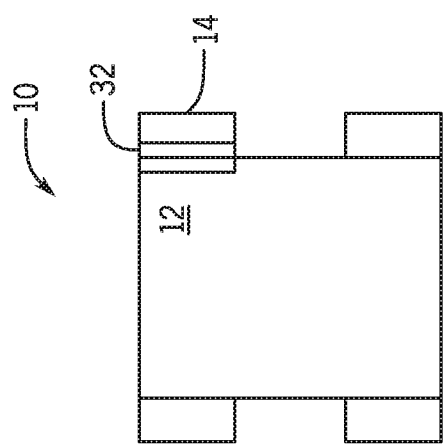
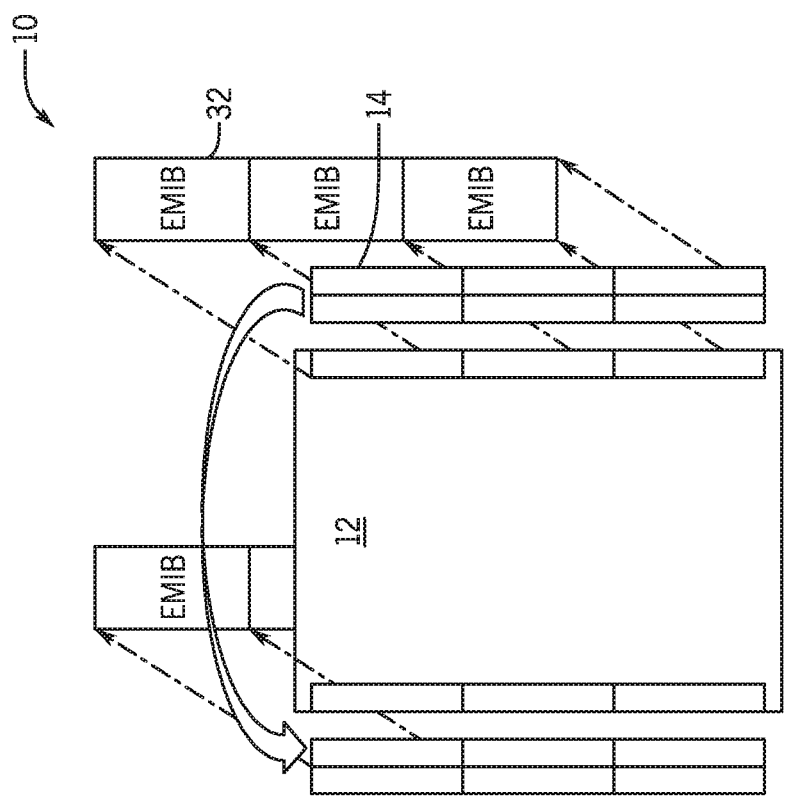

ROTATABLE ARCHITECTURE FOR MULTI-CHIP PACKAGE (MCP)

BACKGROUND

This disclosure relates to a suitable channel bank on an integrated circuit die used to support a different die that includes programmable logic.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuit devices are used in numerous electronic systems. Computers, handheld devices, portable phones, televisions, industrial control systems, robotics, and telecommunication networking—to name just a few—all use integrated circuit devices. Integrated circuit devices may be formed using lithography techniques that pattern circuitry onto a substrate wafer that is diced to form a number of (generally identical) individual integrated circuit die. Each integrated circuit die may include many different components, such as programmable logic fabric, digital or analog signal transmission circuitry, digital signal processing circuitry, application-specific data processing circuitry, memory, and so forth.

In general, different components may be based on different underlying technologies. Thus, a different die may be used for each set of different components. For example, programmable logic fabric such as field programmable gate array (FPGA) fabric may be set on a main die, while high-speed transceivers communicating with the FPGA may be moved off-chip, onto one or more second dies. When multiple second dies are connected on different sides of a main die, however, there may be different second die configurations depending on which side of the main die those second dies are connected. For example, a second die that connects on the right side of the main die may not be able to connect to the left side of the main die. Moreover, if a second die having a "right-side" configuration is inadvertently placed on the left side of the main die, or vice-versa, the second die might be inoperable with the main die.

BRIEF DESCRIPTION OF THE DRAWINGS

Various aspects of this disclosure may be better understood upon reading the following detailed description and upon reference to the drawings in which:

FIG. 7 is a block diagram illustrating a rotatable transceiver tile, allowing a right-side tile to be rotated and used as a left-side transceiver tile, in accordance with an embodiment; and FIG. 8 is a block diagram illustrating multi-die integrated circuit system utilizing rotatable transceiver tiles, assembled on package substrate, in accordance with an embodiment.

DETAILED DESCRIPTION OF SPECIFIC EMBODIMENTS

Figure 1:
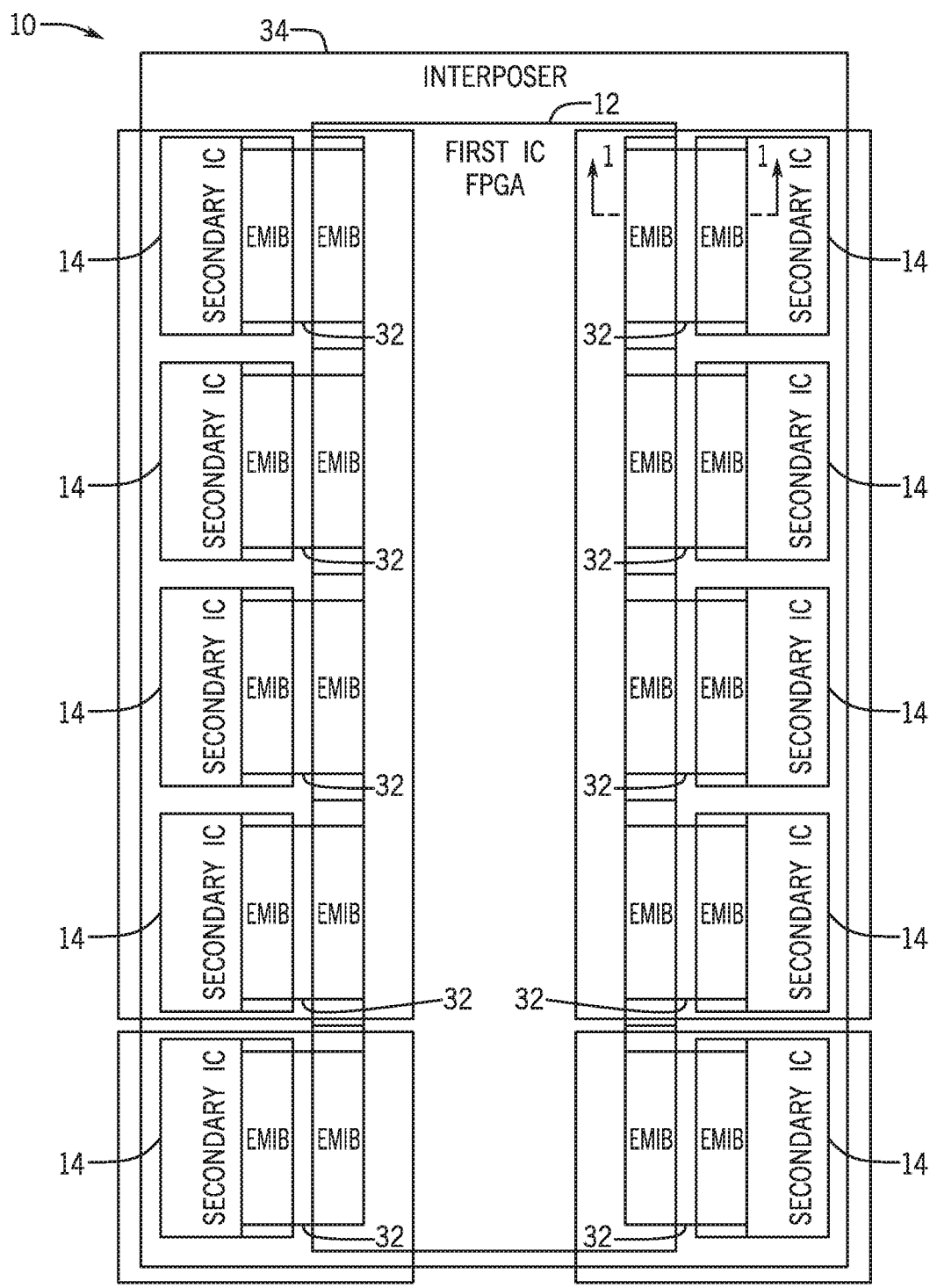
FIG. 1 is a block diagram of a multi-die integrated circuit system with an interface bridge to facilitate efficient communication between the die, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

A multi-chip system may be represented as 2.5D system of separate integrated circuit die that may communicate signals between each other in an efficient matter. In a 2.5D arrangement, the number of connections available between the die may be fewer than may be available if the multiple die were instead part of a single monolithic integrated circuit die. There are many reasons to separate the integrated circuit die, however, rather than combine them into a single monolithic integrated circuit die. In particular, some technologies, such as analog technologies used in high-speed transceivers, may not scale as easily to newer lithography techniques as other circuitry, such as programmable fabric of a programmable logic device (PLD), such as field programmable gate array (FPGA) fabric. Keeping this in mind, high-speed multi-chip packaged FPGA devices may include high-speed transceivers communicating with FPGA fabric, and the transceivers include a left-side transceiver tile (e.g., oriented to connect to left side of FPGA die) to communicate with the left edge of the FPGA fabric and/or a right-side transceiver tile (e.g., oriented to connect to right side of FPGA die) to communicate with the right edge of the FPGA fabric. While this disclosure will primarily use the example of an FPGA die and a transceiver die, the systems and methods of this disclosure may apply to any suitable integrated circuit devices. Indeed, the systems and methods of this disclosure may encompass any suitable first die that may accept a right-side and/or a left-side connection to a second die, which may be rotated to interface with either the right-side connection or the left-side connection. Without limitation to particular types of dies, the first die and/or the second die may represent, for example, a processor, a memory, a transceiver, a programmable logic device such as an FPGA, or a peripheral device, to name only a few.

Using the example of separate dies for FPGA fabric and transceiver, to facilitate communication between the FPGA fabric on one die and transceivers on a second die, the FPGA may include a left edge and right edge that interface with the high-speed transceiver tiles containing transceiver banks of channels. In some architectural arrangements of an FPGA on one die communicating with transceivers tiles on different dies, a particular transceiver tile having a certain arrangement or orientation is used to communicate with the left edge of the FPGA fabric and another transceiver tile is used to communicate with the right edge of the FPGA fabric. Thus, since transceiver tiles are oriented for the left edge and right edge, individual tape-outs are used for each side transceiver tiles. The tape-outs of the left-side and right-side transceiver tiles are not rotatable since the common elements on both the FPGA fabric die and the transceiver tile are not positioned in the same manner. Since the tiles are not rotatable and use individual tape-outs for each side transceiver tiles, each tape-out has its own respective photomask costs. As used herein, channel(s) may also be described as port(s) that facilitate communication across the FPGA fabric die, the transceiver tile, and the like. In some embodiments, the aux channels and data channels used herein should be understood as also being aux port(s) and data port(s) that form a channel of communication when transmitting or receiving between ports.

With the foregoing in mind, transceiver tiles may contain transceiver banks, and transceiver channels may be grouped into these transceiver banks. Each bank may have a certain (e.g., X) number of channels and may include a variety of channel types, such as data channels and/or auxiliary (aux) channels. The aux channels may be used to enable communication between the FPGA and the transceiver through a Secure Device Manager (SDM) of the FPGA, which may be used for device configuration, a Sub-system Manager (SSM) of the transceiver, which may be used to configure transceiver lanes to conform to various input and output protocols, and the like. For example, 16 transceiver channels may be configured for various functionalities, such as a Peripheral Component Interconnect Express (PCIe) ×16 endpoint, 4 bonded ethernet endpoints, or 16 channels of serial (e.g., JESD204b standard) interface connection. In this case, there may be no transceiver channel corresponding to the aux channel if it terminates as the SSM. However, by adding aux channels in the manner described herein, the aux channels may provide communication between the FPGA and transceiver, as well as enable communication between two or more transceivers. The data channels may be used to transfer data received on transceiver channels to send to corresponding configurable FPGA fabric. Thus, the data channels may have one-to-one correspondence with transceiver channels in the transceiver tiles.

When dies are separated, a left-side die or transceiver tile may contain channel configurations that are oriented to interface with a left side of the FPGA while a right-side die or transceiver tile may contain channel configurations that are uniquely compatible with the right side. The compatibility of a left or right transceiver tile may be determined based on the configuration of channels within the channel bank, such that the position of a channel type in a right-side tile may not be in the same position if rotated to be used for a left-side tile, and thus, may be unable to communicate with the different edge of the same FPGA that the transceiver tile may communicate with if differently positioned or oriented. With this in mind, a rotatable transceiver tile may allow the same tile to be used for both the right edge and left edge of the FPGA.

For instance, the ability to use a left-side transceiver tile as a right-side transceiver tile may be achieved by using a rotatable transceiver tile, which may be implemented by adding channel capabilities or changing channel positions within in the transceiver bank of the transceiver tile. It may be desirable to maintain rotatable transceiver tiles that may be used for multiple edges of the FPGA since the same tape-out and photomask of the transceiver tile may be used for both sides. A tape-out is the final result of the design process for integrated circuits or printed circuit boards before they are sent for manufacturing. Specifically, the tape-out is the point at which the graphic design for the photomask of the circuit is sent to a fabrication facility. Lithographic photomasks are layer patterns used to create an integrated circuit. As discussed above, some types of circuit architecture use a separate tape-out for each of the left-side transceiver tiles and right-side transceiver tiles, and thus, uses a separate photomask with separate respective costs. Given these types of architecture, the right-side transceiver tile cannot be rotated and used for the left-side transceiver tile since there would be channel type mismatches.

To enable efficient use of transceiver tiles, transceiver tiles may be configured such that they may be rotatable and used to communicate with the different edge (e.g., right, left, top and bottom) of the FPGA fabric on the separate die. For example, in one embodiment, modifying channel positions or capabilities may allow a transceiver tile to be rotatable and interface with different types of transceivers. As a result, photomask costs for manufacturing one tile design rather than manufacturing two separate designs for each left-side and right-side transceiver tiles' production costs.

By way of introduction, FIG. 1 illustrates an example integrated circuit (IC) system 10 that includes a first integrated circuit (IC) die 12 connected to any suitable number of secondary integrated circuit (IC) die 14. The first IC die 12 and the secondary IC die 14 may be connected through any suitable conductive bridge, such as a silicon bridge 34 or a bridge structure disposed in a substrate (e.g., an Embedded Multi-die Interconnect Bridge (EMIB) by Intel Corporation), or a direct connection between the first IC die 12 and the secondary IC die 14. The first IC die 12 and the secondary IC die 14 may be any suitable integrated circuit devices. In one example, the first IC die 12 may be an integrated circuit device that includes programmable logic fabric such as field-programmable gated arrays (FPGA), and the secondary IC die 14 may be high-speed transceivers. While the examples provided below may refer to the first IC die 12 as an FPGA and refer to the secondary IC die 14 as high-speed transceiver tile(s), other types of integrated circuit devices may benefit from this disclosure. These may include digital processing circuitry, a central processing unit (CPU) subsystem, parallel input/output (I/O) off loading, digital signal processing (DSP) arrays, and the like.

Figure 3:
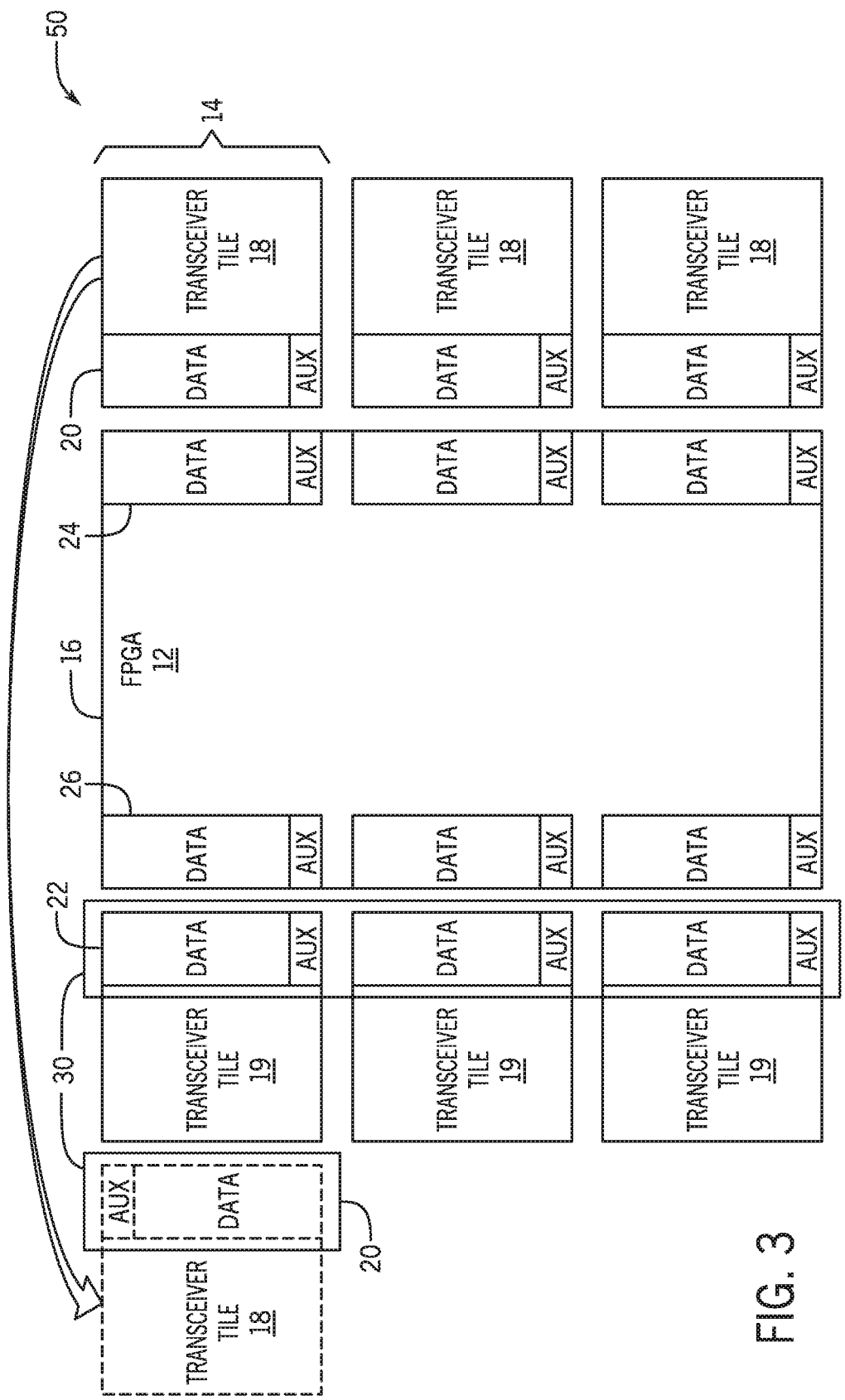
FIG. 3 is a block diagram illustrating the conventional architecture of transceiver tiles of the integrated circuit system of FIG. 1, in accordance with an embodiment.

The IC system 10 may benefit from efficiently using the same transceiver tile (e.g., the secondary IC die 14) for both the left-side and right-side transceiver tiles that couple to the corresponding edge of the FPGA (e.g., first IC die 12 of FIG. 1), as shown in FIG. 3. As such, the transceiver tile may be developed in a rotatable way that may be efficient and compatible to be used interchangeably for both the left and right edges of the FPGA.

The FPGA may connect to the transceiver tile through physical chip-to-chip interconnects of the silicon bridge 34 via a logical interface bridge (IB) 32 that controls the way signals are sent and received. That is, as used herein, the interface bridge 32 represents a logical connection between the FPGA and the transceiver tile. The interface bridge 32 handles signal transfer between physical chip-to-chip interconnects of the silicon bridge 34.

Figure 2:
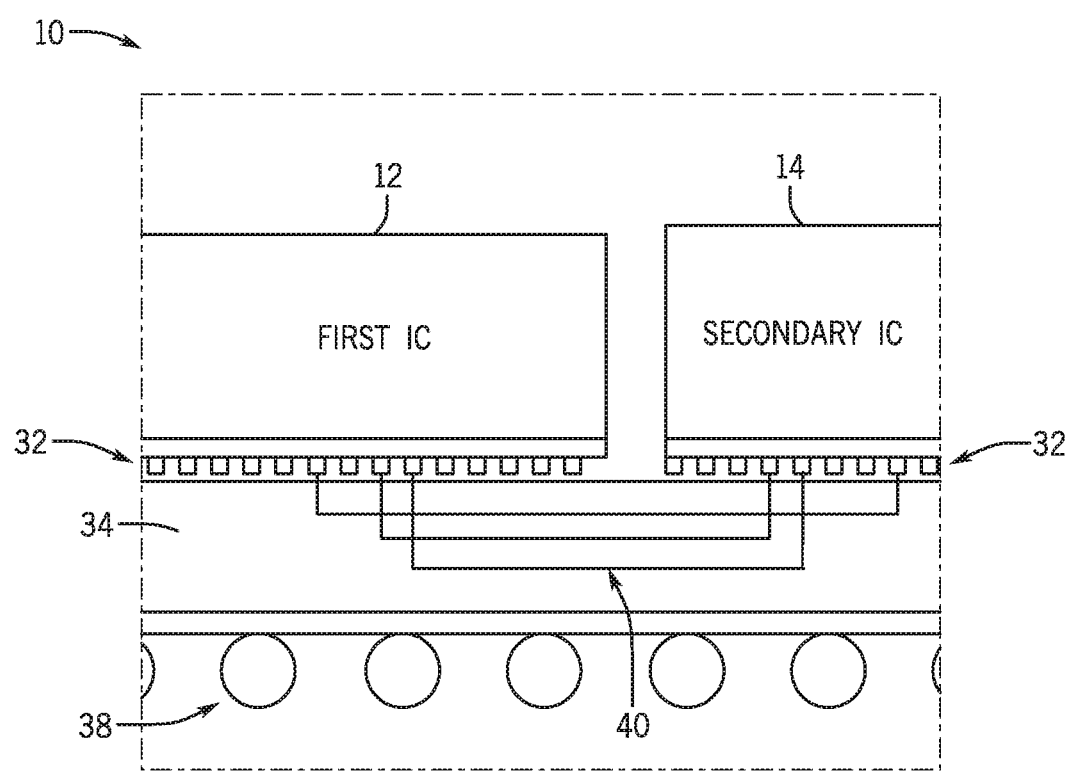
FIG. 2 is a schematic cross-sectional view of a portion of the integrated circuit system of FIG. 1, in accordance with an embodiment.

Referring now to FIG. 2, FIG. 2 shows a schematic cross-sectional view of the IC system 10 along cut lines 1-1 of FIG. 1. As may be seen in FIG. 2, the silicon bridge 34 may be an interposer (as shown) or may be any other suitable silicon bridge (e.g., an interconnect bridge such as an Embedded Multi-die Interconnect Bridge (EMIB) by Intel Corporation) disposed on substrate. In other examples, the first IC die 12 and the secondary IC die 14 may be directly connected to one another through a form of stacking. In the example shown in FIG. 2, the silicon bridge 34 represents an interposer that uses a ball grid array (BGA) of solder balls 38, which may electrically connect to other circuitry, such as a printed circuit board (PCB) (not shown). The physical interconnection between the first IC die 12 and the secondary IC die 14 occurs through corresponding respective interconnect points 32 (here, taking the form of microbumps), which couple to each other through chip-to-chip interconnects 40 within the silicon bridge 34.

It should be understood that FIG. 2 represents a 2.5D arrangement that uses a silicon bridge 34 to connect the first IC die 12 and the secondary IC die 14. In other embodiments, the first IC die 12 and the secondary IC die 14 may be connected in a 3D arrangement, in which case the interconnect points 32 may directly connect to the other IC. For instance, the secondary IC die 14 may be stacked on top of the first IC die 12 and the interconnect points 32 may directly connect to corresponding interconnect structures on the first IC die 12.

As previously mentioned, a right-side transceiver tile (e.g., secondary IC die 14) may include at least one transceiver bank with multiple channels oriented at 180 degrees, including a variety of channels (e.g., data channels and aux channels), and the channels are positioned such that the transceiver tile may couple to the corresponding edge of the FPGA (e.g., first IC die 12). To use the same design for the left-side transceiver tile, a new tape-out and photomask is created to allow compatibility with the right edge of the FGPA. By adding multiple channel capabilities to the different transceiver bank channels, the channel bank, and thus, the transceiver tile, becomes rotatable. The rotatable tile may be used to communicate with both the right edge and left edge of the FPGA. The configuration of the transceiver bank channels may include adding aux channels to either all data channels for an even or odd number of channels configuration, adding aux channels to the top and bottom data channels for an even or odd number of channels configuration, or adding an aux channel to the middle data channel for an even or odd number of channels configuration. Adding aux channel capability to data channels in these design configurations may allow for transceiver tile adaptability so that the same design may be used for both left and right-side transceiver tiles. Moreover, although some of the following descriptions describe a transceiver bank of a left-side transceiver tile and a transceiver bank of right-side transceiver tile, which represent a particular embodiment, it should be noted that the devices described herein may be used on a single transceiver tile with matching transceiver bank channel configurations on either side of the transceiver tile, such that the tile may be used to communicate with either side (e.g., right edge and left edge) of the FPGA fabric without rotation.

To help illustrate, a block diagram 50 of a detailed view of a non-rotatable architecture of transceiver bank channels of a left-side transceiver tile 19 and right-side transceiver tile 18 is shown in FIG. 3. In particular, the block diagram 50 shows an orientation of the right-side transceiver tile 18 and left-side transceiver tile 19 (e.g., which may be part of the secondary IC die 14) positioned to communicate with a respective edge of the FPGA 16. In some embodiments, the transceiver banks 20, 22 of the right-side transceiver tile 18 and left-side transceiver tile 19 may contain multiple data channels and one aux channel. As shown, in one particular embodiment, the one aux channel may be positioned as the bottom channel of the transceiver banks 20, 22 for both the right-side and left-side transceiver tiles 18, 19. Although the design and configuration appears to be the same, the right-side and left-side transceiver tiles 18, 19 communicate with opposite edges of the FPGA 16.

For example, as illustrated, rotating the right-side transceiver tile 18 containing the right-side transceiver bank 20 to be used with the left edge 26 of the FPGA 16 will position the aux channel of the right-side transceiver tile 18 at the top of the right-side transceiver bank 20. Thus, simply rotating the right-side transceiver tile 18 does not allow for compatible communication with the left edge 26 of the FPGA 16 since there is a channel compatibility 30 mismatch. Modifying the type and positioning of channels in transceiver banks, such as a right-side transceiver bank 20 of a right-side transceiver tile 18, as well as modifying the corresponding edges (e.g., right edge 24 and left edge 26) of the FPGA 16 to correspond to a modified transceiver tile 15, as shown in FIG. 4, may allow for the transceiver tile 15 to be rotated and used as a left-side transceiver tile 19 or a right-side transceiver tile 18 and allow for communication between the two dies (e.g., FPGA 16 and transceiver tiles 15) regardless of the positioning of the two dies.

Figure 4:
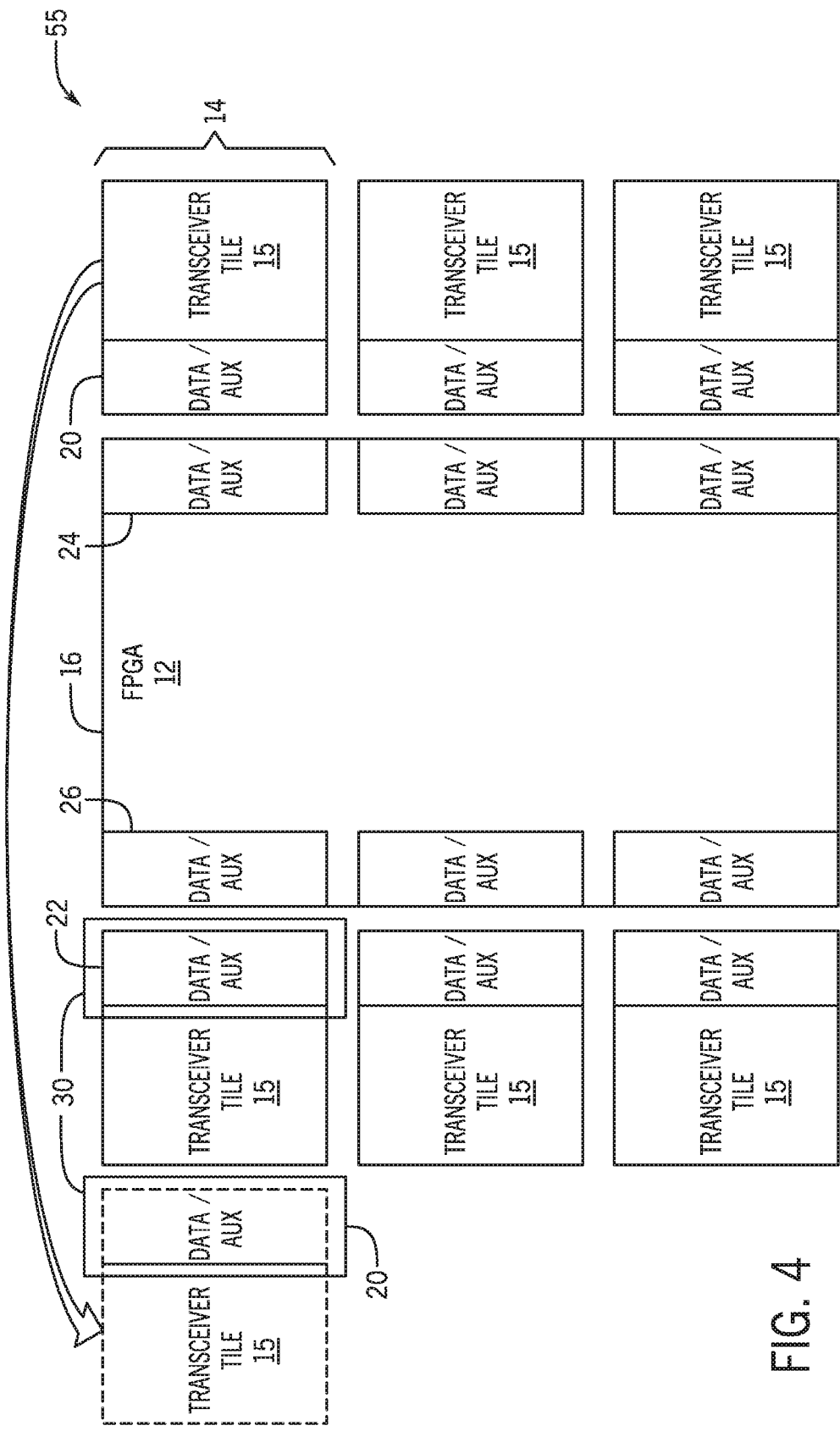
FIG. 4 is a block diagram illustrating a rotatable transceiver tiles that include data and auxiliary capability for all channels, in accordance with an embodiment.

With the foregoing in mind, a block diagram 55 of FIG. 4 illustrates a rotatable transceiver tile 15 that incorporates the aux capability into all data channels, in accordance with an embodiment of the present disclosure. Regardless of the number of channels (e.g., even or odd) in the transceiver banks 20, 22, each data channel may include aux capability. Similarly, the FPGA 16 channel configurations may also be modified to correspond to the secondary IC circuit die 14 containing the transceiver bank 20, 22.

Since each channel includes both aux and data capabilities, a right-side transceiver bank 20 contained in the rotatable transceiver tile 15 positioned on the right side of the FPGA 16 may be rotated to be used on the left side of the FPGA 16. Thus, the rotatable transceiver tile 15 with data and aux channels capability in all channels, may be rotated to the left and allow for compatible communication with the left edge 26 of the FPGA 16 since there is a channel compatibility 30 match to allow for communication between the two dies.

Figure 5:
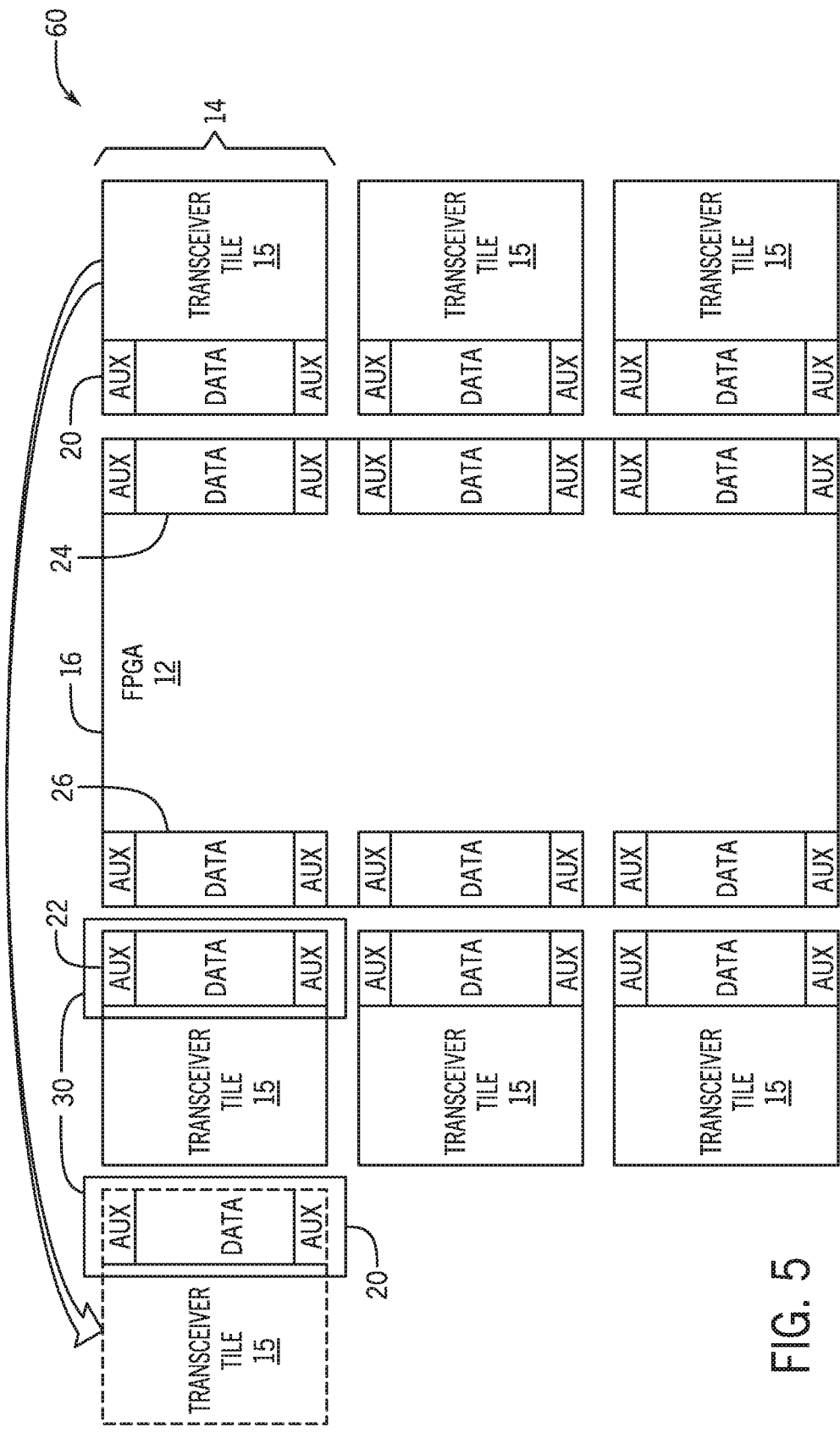
FIG. 5 is a block diagram illustrating a rotatable transceiver tile that include auxiliary capability for the middle channel(s), in accordance with an embodiment.

Additionally, incorporating aux channels or aux capability into the top and bottom channels may be another embodiment for facilitating the rotatable transceiver tile 15, as illustrated in a block diagram 60 of FIG. 5. As depicted in this embodiment, the top and bottom channels of the rotatable transceiver tile 15 disposed on the right side of the FPGA 16 may include aux channels or include aux capability, while the remaining middle channels may be data channels. The number of channels in this configuration may be incorporated into either an even or odd number of channels in the transceiver bank 20, 22.

Since the top and bottom channels may be aux channels or include aux capability while the middle channels are data channels, the rotatable transceiver tile 15 disposed on the right side of the FPGA 16 may be rotated to be used on the left side of the FPGA 16. Thus, the rotatable transceiver tile 15 with such configuration, may be rotated to the left-side and allow for compatible communication with the left edge 26 of the FPGA 16 since there is a channel compatibility 30 match.

Figure 6:
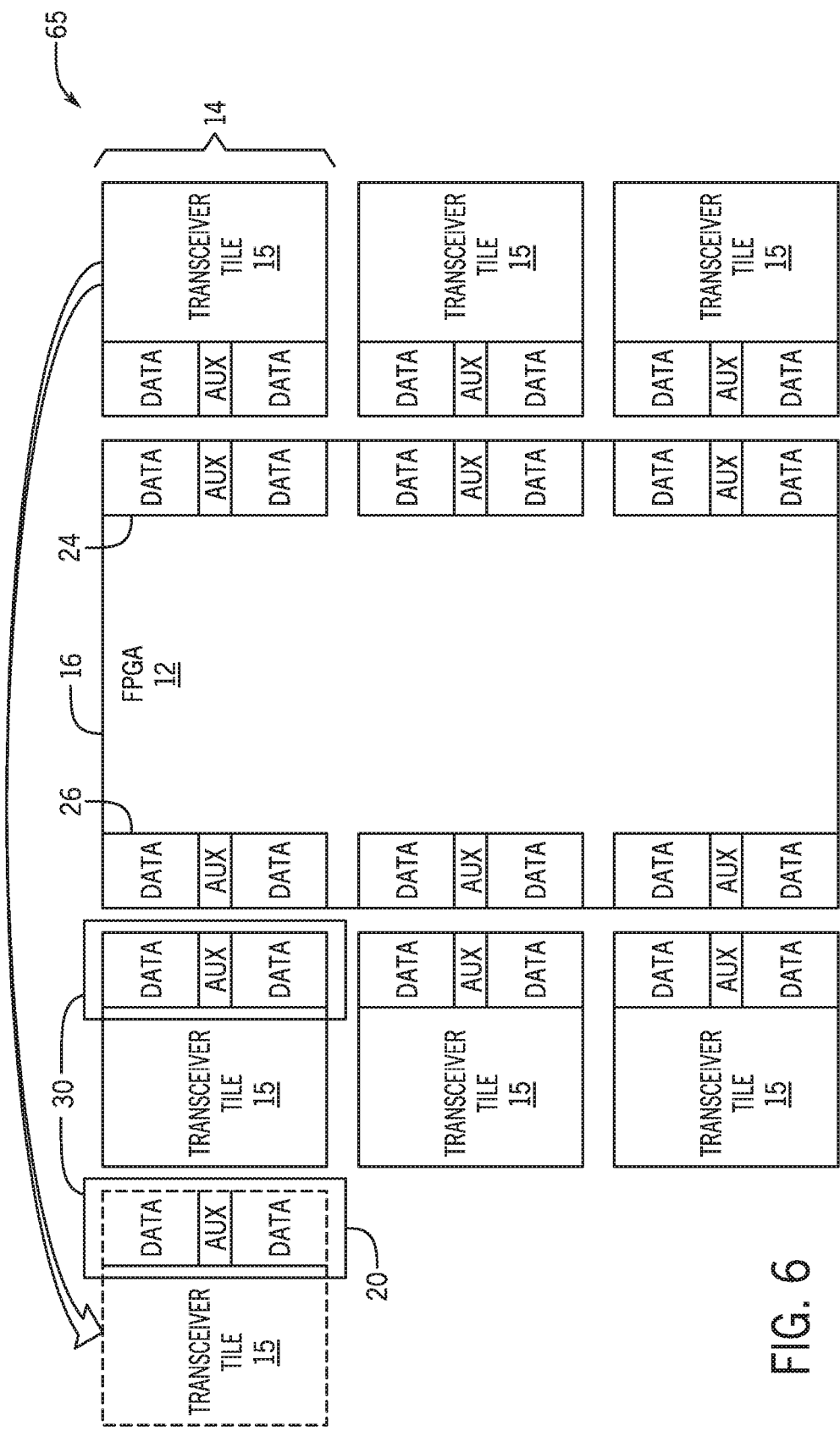
FIG. 6 is a block diagram illustrating a rotatable transceiver tile that includes auxiliary capability for top and bottom channels, in accordance with an embodiment.

Furthermore, a block diagram 65 of FIG. 6 depicts the rotatable transceiver tile 15 including a middle channel that has as an aux channel or includes aux capability while the remaining channels may be data channels, in accordance with an embodiment of the present disclosure. Similarly, the channel configuration of the FPGA 16 may be modified to correspond to the transceiver tile 15 containing transceiver banks 20, 22 to allow for communication between the two dies. Accordingly, the number of channels in this configuration may exemplify an odd number of channels in the transceiver banks of the rotatable transceiver tile 15. However, this configuration may also be implemented in a transceiver banks of the rotatable transceiver tile 15 with an even number of channels. That is, transceiver tiles 15 and FPGA 16 including an even number of channels may use the middle channels (e.g., suitable even number) as aux channels or including aux capability while using the top and bottom channels as data channels, thereby enabling the transceiver tile 15 and FPGA 16 to be rotatable. As such, middle channels (e.g., one or more) may be aux channels or include aux capability to facilitate rotatability of the die.

Because the middle channel may be aux channels or include aux capability, a transceiver bank of the transceiver tile 15 may be rotated from the right side of the FPGA 16 to be used on the left side of the FPGA 16. Thus, the transceiver tile 15 with aux middle channel(s) may be rotated to the left and allow for compatible communication with the left edge 26 of the FPGA 16 since there is a channel compatibility 30 match to allow for communication between the two dies.

Considering the discussed implementations for a rotatable transceiver tile 15, block diagram of an integrated system 10 of FIG. 1 is shown in FIG. 7, illustrating an FPGA 16 (e.g., first IC die 12 of FIG. 1) and rotatable transceiver tiles 15 (e.g., secondary IC die 14 of FIG. 1) in accordance with one of the embodiments of this disclosure. As previously discussed and as illustrated, the first IC die 12 and secondary IC die 14 may be connected through a bridge structure disposed on a substrate, such as EMIB 34.

As disclosed, a rotatable secondary IC die 14 (e.g., transceiver tile 15) may allow for the same tiles to be used to communicate with the different edges of the first IC die 12 (e.g., FPGA 16). In some embodiments, the first IC die 12 may be an FPGA 16 and the secondary IC die 14 may be transceiver tiles 15, and repositioning or adding channel capabilities (e.g., aux channels) may allow for efficient use of the same transceiver tiles 15 to communicate with the different edges of the FPGA 16. Since the same transceiver tile 15 may be rotated and used to communicate with both edges of the FPGA 16, only one design or photomask of transceiver tile may be sent for manufacturing to facilitate the communication between a variety of FPGAs 16.

Accordingly, the block diagram of an integrated system 10 in FIG. 8 illustrates a first IC die 12 and a rotatable secondary IC die 14, assembled on a package substrate. As depicted, the left-side and right-side secondary IC dies 14 are the same. The integrated system 10 may be a high-speed multi-chip packaged FPGA device, in accordance with an embodiment of the present disclosure. Thus, the rotatable transceiver tiles 15 may be adaptable to the different fabric edges of the FPGA 16. Moreover, the respective costs of the efficient and adaptive rotatable transceiver tiles and the overall package substrate may be decreased.

Thus, one or more of the disclosed embodiments, alone or in combination, may provide one or more technical effects including improving efficiency in implementing a high-speed multi-chip packaged FPGA device. In particular, the disclosed embodiments may allow for a rotatable transceiver tile 15 that may be used on either side of the FPGA 16 fabric. For instance, a transceiver tile 15 may contain transceiver banks 20, 22 with multiple channels, such as aux and data channels, and the aux channels or aux capability may be repositioned or added. Rotatable functionality may be achieved by using all channels as data and aux channels, orienting aux channels or aux capability at the top and bottom channels while the middle channels may be data channels, or orienting the aux channel or capability in the middle channel(s) while all other channels may be data channels. In this manner, the techniques described herein enable transceiver tiles 15 to be rotatable. The rotatable functionality allows for the transceiver tile 15 to be compatible and used for both edges of the FPGA 16 fabric, thus, increasing efficiency of the overall high-speed multi-chip packaged FPGA device while decreasing the associated production costs.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

Example Embodiments of the Disclosure

The following numbered clauses define certain example embodiments of the present disclosure.

CLAUSE 1.

A multi-chip packaged device, comprising:
a first integrated circuit die comprising:
a first plurality of ports disposed on a first side of the first integrated circuit die; and
a second plurality of ports disposed on a second side of the first integrated circuit die; and a second integrated circuit die comprising a third plurality of ports disposed on a first side of the second integrated circuit die, wherein the second integrated circuit die is configured to communicate with the first integrated circuit via the third plurality of ports and the first plurality of ports when the first side of the first integrated circuit die is placed adjacent to the first side of the second integrated circuit die, and wherein the second integrated circuit die is configured to communicate with the first integrated circuit die via the third plurality of ports and the second plurality of ports when the second side of the first integrated circuit die is placed adjacent to the first side of the second integrated circuit die.

CLAUSE 2.

The multi-chip packaged device of clause 1, wherein the third plurality of ports is configured to enable the second integrated circuit die to communicate with either the first plurality of ports of the first integrated circuit die or the second plurality of ports of the first integrated circuit die.

CLAUSE 3.

The multi-chip packaged device of clause 1, wherein the first integrated circuit die comprises a field programmable gate array (FPGA).

CLAUSE 4.

The multi-chip packaged device of clause 3, wherein the second integrated circuit die comprises a transceiver.

CLAUSE 5.

The multi-chip packaged device of clause 4, wherein the first plurality of ports of the first integrated circuit die, the second plurality of ports of the first integrated circuit die, and the third plurality of ports of the second integrated circuit die is configured to communicate via one or more data channels and one or more auxiliary channels.

CLAUSE 6.

The multi-chip packaged device of clause 5, wherein the one or more auxiliary channels are configured to transmit and receive data between the FPGA and the transceiver, the transceiver and a different transceiver, or both.

CLAUSE 7.

The multi-chip packaged device of clause 1, wherein each of the first plurality of ports, the second plurality of ports, and the third plurality of ports is configured to communicate via one or more data channels and one or more auxiliary channels, and wherein the one or more data channels and the one or more auxiliary channels are configured to enable the second integrated circuit die to communicate with the first integrated circuit die via each of the first plurality of ports or each of the second plurality of ports.

CLAUSE 8.

The multi-chip packaged device of clause 1, wherein the first plurality of ports, the second plurality of ports, and the third plurality of ports are configured to communicate via a first set of auxiliary channels, a second set of auxiliary channels, and a third set of auxiliary channels, respectively, and wherein the third set of auxiliary channels is configured to enable the second integrated circuit die to communicate with the first integrated circuit die via one or more middle ports of the first plurality of ports or the second plurality of ports.

CLAUSE 9.

The multi-chip packaged device of clause 8, wherein the one or more middle ports comprises a first even-number of ports, and wherein the first plurality of ports comprises a second even-number of ports.

CLAUSE 10.

The multi-chip packaged device of clause 1, wherein the first plurality of ports, the second plurality of ports, and the third plurality of ports are configured to communicate via a first set of auxiliary channels, a second set of auxiliary channels, and a third set of auxiliary channels, respectively, and wherein the third set of auxiliary channels is configured to enable the second integrated circuit die to communicate with the first integrated circuit die via a top port and a bottom port of the first plurality of ports, the second plurality of ports, and the third plurality of ports.

CLAUSE 11.

An integrated circuit die, comprising:

a first plurality of ports disposed on a first side of the integrated circuit die, wherein the first side of the integrated circuit die is configured to communicate with an additional integrated circuit die via a second side of the additional integrated circuit die or a third side of the additional integrated circuit die, wherein the additional integrated circuit die comprises a second plurality of ports disposed on the second side of the additional integrated circuit die and a third plurality of ports disposed on the third side of the additional integrated circuit die, and wherein a portion of each of the first plurality of ports, the second plurality of ports, and the third plurality of ports are configured to communicate via one or more auxiliary channels and are positioned such that the first plurality of ports may interface with the second plurality of ports and the third plurality of ports when the integrated circuit die is oriented in a first direction or when the integrated circuit die is oriented in a second direction that corresponds to the integrated circuit die being rotated 180 degrees with respect to the first direction.

CLAUSE 12.

The integrated circuit die of clause 11, wherein the portion of each of the first plurality of ports, the second plurality of ports, and the third plurality of ports is positioned in the middle of the first plurality of ports, the second plurality of ports, and the third plurality of ports.

CLAUSE 13.

The integrated circuit die of clause 11, wherein the portion of each of the first plurality of ports, the second plurality of ports, and the third plurality of ports is positioned on at least two outer ends of the first plurality of ports, the second plurality of ports, and the third plurality of ports.

CLAUSE 14.

The integrated circuit die of clause 11, wherein an additional portion of the first plurality of ports, the second plurality of ports, and the third plurality of ports is configured to communicate via one or more data channels.

CLAUSE 15.

The integrated circuit die of clause 11, wherein each of the first plurality of ports, the second plurality of ports, and the third plurality of ports comprises an odd number of ports, and wherein the portion of the first plurality of ports, the second plurality of ports, and the third plurality of ports comprises one port, and wherein the one or more auxiliary channels correspond to communication from a middle of the first plurality of ports, the second plurality of ports, and the third plurality of ports.

CLAUSE 16.

The integrated circuit die of clause 11, wherein each of the first plurality of ports, the second plurality of ports, and the third plurality of ports comprises a first even number of ports, and wherein communication via the one or more auxiliary channels comprises a second even number of ports.

CLAUSE 17.

The integrated circuit die of clause 11, wherein the integrated circuit die is physically connected to the additional integrated circuit die via one or more interconnect points, and wherein the one or more interconnect points comprise one or more microbumps.

CLAUSE 18.

A multi-chip packaged device, comprising:
a first integrated circuit die comprising a first plurality of ports disposed on a first side of the first integrated circuit die and a second plurality of ports disposed on a second side of the first integrated circuit die, or both; and
a second integrated circuit die comprising a third plurality of ports disposed on a first side of the second integrated circuit die, wherein the first integrated circuit die is configured to communicate with the first side of the second integrated circuit die via the first side or the second side of the first integrated circuit die, wherein each of the first plurality of ports, the second plurality of ports, and the third plurality of ports is configured to communicate via at least one auxiliary channel formed via a top port and a bottom port of the first plurality of ports, the second plurality of ports, and the third plurality of ports.

CLAUSE 19.

The multi-chip packaged device of clause 16, wherein each of the first plurality of ports, the second plurality of ports, and the third plurality of ports is configured to communicate via one or more data channels via a portion of each of the first plurality of ports, the second plurality of ports, and the third plurality of ports, wherein the portion is positioned between the top port and the bottom port of the first plurality of ports, the second plurality of ports, and the third plurality of ports.

CLAUSE 20.

The multi-chip packaged device of clause 16, wherein the first side and the second side are disposed on opposite sides of the first integrated circuit die.

The invention claimed is:

1. A multi-chip packaged device, comprising:
a first integrated circuit die comprising a first integrated circuit, wherein the first integrated circuit comprises a first plurality of channels disposed on a first side of the first integrated circuit die and a second plurality of channels disposed on a second side of the first integrated circuit die; and
a second integrated circuit die comprising a second integrated circuit, wherein the second integrated circuit comprises a third plurality of channels disposed on a third side of the second integrated circuit die, wherein the third plurality of channels have an arrangement that enables:
a connection to the first plurality of channels if the multi-chip package has a first configuration in which the third side of the second integrated circuit die faces the first side of the first integrated circuit die; and
a connection to the second plurality of channels if the multi-chip package has a second configuration in which the third side of the second integrated circuit die faces the second side of the first integrated circuit die.

2. The multi-chip packaged device of claim 1, wherein the third plurality of channels is configured to enable the second integrated circuit to be rotated and communicate with either the first plurality of channels or the second plurality of channels of the first integrated circuit.

3. The multi-chip packaged device of claim 1, wherein the first integrated circuit comprises a field programmable gate array (FPGA).

4. The multi-chip packaged device of claim 3, wherein the second integrated circuit comprises a transceiver.

5. The multi-chip packaged device of claim 4, wherein the first plurality of channels, the second plurality of channels, and the third plurality of channels comprise one or more data channels and one or more auxiliary channels.

6. The multi-chip packaged device of claim 5, wherein the one or more auxiliary channels are configured to transmit and receive data between the FPGA and the transceiver.

7. The multi-chip packaged device of claim 1, wherein the first plurality of channels, the second plurality of channels, and the third plurality of channels comprise one or more data channels and one or more auxiliary channels, and wherein the one or more data channels and the one or more auxiliary channels are configured to enable the second integrated circuit to communicate with the first integrated circuit via each of the first plurality of channels or each of the second plurality of channels.

8. The multi-chip packaged device of claim 1, wherein the first plurality of channels, the second plurality of channels, and the third plurality of channels comprise a first set of auxiliary channels, a second set of auxiliary channels, and a third set of auxiliary channels, respectively, and wherein the third set of auxiliary channels is configured to enable the second integrated circuit to communicate with the first integrated circuit via one or more middle channels of the first plurality of channels or the second plurality of channels.

9. The multi-chip packaged device of claim 8, wherein the one or more middle channels comprises a first even-number of channels, and wherein the first plurality of channels comprises a second even-number of channels.

10. The multi-chip packaged device of claim 1, wherein the first plurality of channels, the second plurality of channels, and the third plurality of channels comprise a first set of auxiliary channels, a second set of auxiliary channels, and a third set of auxiliary channels, respectively, and wherein the third set of auxiliary channels is configured to enable the second integrated circuit to communicate with the first integrated circuit via a top and a bottom channel of the first plurality of channels, the second plurality of channels, and the third plurality of channels.

11. A multi-chip packaged device, comprising:
a first integrated circuit die comprising a first integrated circuit, wherein the first integrated circuit comprises a first plurality of channels disposed on a first side of the first integrated circuit die and a second plurality of channels disposed on a second side of the first integrated circuit die, wherein the first plurality of channels comprises one or more auxiliary channels disposed in a middle of the first plurality of channels, and wherein the second plurality of channels comprises one or more auxiliary channels disposed in a middle of the second plurality of channels; and
a second integrated circuit die comprising a second integrated circuit, wherein the second integrated circuit comprises a third plurality of channels disposed on a third side of the second integrated circuit die, wherein the third plurality of channels comprises one or more auxiliary channels disposed in a middle of the third plurality of channels, thereby enabling the third plurality of channels to communicate with the first plurality of channels if the multi-chip package has a first configuration in which the third side of the second integrated circuit die faces the first side of the first integrated circuit die and enabling the third plurality of channels to communicate with the second plurality of channels if the multi-chip package has a second configuration in which the third side of the second integrated circuit die faces the second side of the first integrated circuit die.

12. The multi-chip packaged device of claim 11, wherein one or more remaining channels of the first plurality of channels, the second plurality of channels, and the third plurality of channels comprise one or more data channels.

13. The multi-chip packaged device of claim 1, wherein each of the first plurality of channels, the second plurality of channels, and the third plurality of channels comprises an odd number of channels, and wherein the one or more auxiliary channels comprises one channel.

14. The multi-chip packaged device of claim 1, wherein each of the first plurality of channels, the second plurality of channels, and the third plurality of channels comprises a first even number of channels, and wherein the one or more auxiliary channels comprises a second even number of channels.

15. The multi-chip packaged device of claim 1, wherein the first integrated circuit die is physically connected to the second integrated circuit die via one or more interconnects points, and wherein the one or more interconnect points comprise one or more microbumps.

16. A multi-chip packaged device, comprising:
a first integrated circuit die comprising a first integrated circuit, wherein the first integrated circuit comprises a first plurality of channels accessible along a first side of the first integrated circuit die and a second plurality of channels accessible along a second side of the first integrated circuit die, wherein the first plurality of channels comprises at least one auxiliary channel disposed in a top position among the first plurality of channels and at least one auxiliary channel disposed in a bottom position among the first plurality of channels, and wherein the second plurality of channels comprises at least one auxiliary channel disposed in a top position among the second plurality of channels and at least one auxiliary channel disposed in a bottom position among the second plurality of channels; and a second integrated circuit die comprising a second integrated circuit, wherein the second integrated circuit comprises [[of]] a third plurality of channels accessible along a third side of the second integrated circuit die, wherein the third plurality of channels comprises at least one auxiliary channel disposed in a top position among the third plurality of channels and at least one auxiliary channel disposed in a bottom position among the third plurality of channels, thereby enabling the third plurality of channels to communicate with the first plurality of channels if the multi-chip package has a first configuration in which the third side of the second integrated circuit die faces the first side of the first integrated circuit die and enabling the third plurality of channels to communicate with the second plurality of channels if the multi-chip package has a second configuration in which the third side of the second integrated circuit die faces the second side of the first integrated circuit die.

17. The multi-chip packaged device of claim 16, wherein each of the first plurality of channels, the second plurality of channels, and the third plurality of channels comprises one or more data channels disposed in between the top and the bottom of the first plurality of channels, the second plurality of channels, and the third plurality of channels.

18. The multi-chip packaged device of claim 16, wherein the first side and the second side are disposed on opposite sides of the first integrated circuit.

19. The multi-chip packaged device of claim 16, wherein the first integrated circuit comprises a field programmable gate array (FPGA).

20. The multi-chip packaged device of claim 16, wherein the second integrated circuit comprises a transceiver.

* * * * *